United States Patent
Han et al.

(10) Patent No.: US 10,483,414 B2
(45) Date of Patent: Nov. 19, 2019

(54) STACK-TYPE IMAGE SENSOR INCLUDING META-FILTER

(71) Applicant: SAMSUNG ELECTRONICS CO., LTD., Suwon-si (KR)

(72) Inventors: Seunghoon Han, Seoul (KR); Lilong Shi, Pasadena, CA (US); Kwanghee Lee, Hwaseong-si (KR); Changgyun Shin, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 57 days.

(21) Appl. No.: 15/830,166

(22) Filed: Dec. 4, 2017

(65) Prior Publication Data

US 2018/0158856 A1 Jun. 7, 2018

(30) Foreign Application Priority Data

Dec. 5, 2016 (KR) ........................ 10-2016-0164389

(51) Int. Cl.
| | |
|---|---|
| *H01L 31/0232* | (2014.01) |
| *H01L 27/146* | (2006.01) |
| *H01L 27/30* | (2006.01) |
| *H01L 51/42* | (2006.01) |
| *H01L 31/103* | (2006.01) |
| *H01L 31/101* | (2006.01) |

(52) U.S. Cl.
CPC .. *H01L 31/02327* (2013.01); *H01L 27/14621* (2013.01); *H01L 27/14629* (2013.01); *H01L 27/14647* (2013.01); *H01L 27/307* (2013.01); *H01L 31/103* (2013.01); *H01L 31/1013* (2013.01); *H01L 51/42* (2013.01)

(58) Field of Classification Search
CPC ......... H01L 31/02325; H01L 31/02327; H01L 27/14621; H01L 27/14629; H01L 27/14643–14647
See application file for complete search history.

(56) References Cited

U.S. PATENT DOCUMENTS

| | | | |
|---|---|---|---|
| 9,184,198 B1 | 11/2015 | Miao et al. | |
| 2004/0188599 A1* | 9/2004 | Viktorovitch | G01J 3/02 250/226 |
| 2010/0178018 A1* | 7/2010 | Augusto | G02B 6/12 385/131 |
| 2010/0238432 A1* | 9/2010 | Hillis | G01J 1/42 356/222 |

(Continued)

FOREIGN PATENT DOCUMENTS

| | | |
|---|---|---|
| KR | 2002-0058455 A | 7/2002 |
| KR | 10-2007-0047410 A | 5/2007 |

(Continued)

*Primary Examiner* — Scott B Geyer
(74) *Attorney, Agent, or Firm* — Sughrue Mion, PLLC

(57) ABSTRACT

A stack-type image sensor may include a photodiode and a meta-filter. The photodiode may include a first photodiode configured to absorb first light of a first wavelength band and a second photodiode disposed on the first photodiode and configured to absorb second light of a second wavelength band. The meta-filter may include a first meta-filter disposed in a lower portion of the first photodiode and configured to reflect the first light of the first wavelength band to the first photodiode.

20 Claims, 11 Drawing Sheets

(56) References Cited

U.S. PATENT DOCUMENTS

| | | | |
|---|---|---|---|
| 2011/0136288 A1* | 6/2011 | Duane | H01L 21/02381 |
| | | | 438/59 |
| 2011/0169117 A1* | 7/2011 | McIntosh | H01L 27/1446 |
| | | | 257/432 |
| 2012/0267694 A1* | 10/2012 | Kaiser | H01L 27/14614 |
| | | | 257/291 |
| 2014/0055655 A1* | 2/2014 | Kokubun | H04N 5/374 |
| | | | 348/308 |
| 2016/0099272 A1* | 4/2016 | Wang | H01L 27/14621 |
| | | | 257/435 |
| 2017/0115436 A1* | 4/2017 | Qian | H01L 27/14621 |
| 2017/0287981 A1 | 10/2017 | Han et al. | |
| 2019/0079201 A1* | 3/2019 | Street | G01T 1/2018 |

FOREIGN PATENT DOCUMENTS

| | | |
|---|---|---|
| KR | 10-2015-0141035 A | 12/2015 |
| KR | 10-2017-0112951 A | 10/2017 |

\* cited by examiner

STACK-TYPE IMAGE SENSOR INCLUDING META-FILTER

CROSS-REFERENCE TO RELATED APPLICATIONS

This application claims priority from Korean Patent Application No. 10-2016-0164389, filed on Dec. 5, 2016, in the Korean Intellectual Property Office, the disclosure of which is incorporated herein in its entirety by reference.

BACKGROUND

1. Field

The present disclosure relates to stack-type image sensors including meta-filters.

2. Description of the Related Art

An image sensor that captures an image of an object and converts the captured image into an electrical signal is used in a camera mounted on a vehicle, a security device, or a robot, as well as a general consumer electronic device such as a digital camera, a mobile phone camera, or a portable camcorder. Such an image sensor may include a pixel array. Each unit pixel included in the pixel array may include a light sensing device. The light sensing device may generate an electrical signal according to the intensity of absorbed light. For example, a photodiode from among the light sensing devices may generate a current by absorbing light.

The image sensor may include, in addition to the light sensing device, a transistor for controlling the light sensing device, a circuit for driving the pixel array, and a circuit for measuring an output signal of the pixel array. These additional elements may be formed during a semiconductor manufacturing process. An electrical signal generated by the light sensing device may pass through at least one transistor and may be converted into an output signal whose voltage may vary according to the intensity of light. The pixel array may output the output signal to another device or component.

The image sensor needs to be very small when it is used in mobile devices such as a cellular phone, a digital camera, a display device, etc. Therefore, it is necessary to further reduce the size of the image sensor or increase the number of pixels of the image sensor formed on one substrate.

SUMMARY

Provided are stack-type image sensors including meta-filters that satisfy a subwavelength condition and adjust transmittance and reflection degree of light according to a wavelength of incidence light.

Additional aspects will be set forth in part in the description which follows and, in part, will be apparent from the description, or may be learned by practice of various exemplary embodiments.

According to an aspect of an exemplary embodiment, a stack-type image sensor may include: a photodiode including a first photodiode configured to absorb first light of a first wavelength band, and a second photodiode disposed on the first photodiode and configured to absorb second light of a second wavelength band; and a meta-filter including a plurality of nanostructures that satisfy a subwavelength condition, the meta-filter being configured to reflect light of a previously determined wavelength band, and to transmit light of wavelength bands other than the previously determined wavelength band, wherein the meta-filter further includes a first meta-filter disposed in a lower portion of the first photodiode, the first meta filter being configured to reflect the first light of the first wavelength band to the first photodiode.

The meta-filter may further include a second meta-filter disposed between the first photodiode and the second photodiode, the second meta-filter being configured to reflect the second light of the second wavelength band to the second photodiode and to transmit the first light of the first wavelength band.

The first photodiode may be a silicon photodiode having no light selectivity or may be any one of an organic photodiode and a quantum dot photodiode having light selectivity to sense the first light of the first wavelength band.

The second photodiode may be one of an organic photodiode and a quantum dot photodiode having light selectivity to sense the second light of the second wavelength band.

The photodiode may further include a third photodiode disposed on the second photodiode and configured to absorb third light of a third wavelength band. The meta-filter may further include a third meta-filter disposed between the second photodiode and the third photodiode, and configured to reflect the third light of the third wavelength band to the third photodiode and to transmit light of other wavelength bands.

The third photodiode may be one of an organic photodiode and a quantum dot photodiode having light selectivity to sense the third light of the third wavelength band.

The first meta-filter may reflect the third light of a third wavelength band.

The meta-filter may include a nanostructure arrangement having a repeat distance less than a half of a center wavelength of a wavelength band.

The second photodiode may be an organic photodiode having a thickness ranging from 30 nm to 250 nm.

The third photodiode may be an organic photodiode having a thickness ranging from 30 nm to 250 nm.

The third wavelength band may be one of a red wavelength band, a green wavelength band, and a blue wavelength band. The second wavelength band may be one of the red wavelength band, the green wavelength band, and the blue wavelength band, the second wavelength band being different from the third wavelength band. The first wavelength band may be one of the red wavelength band, the green wavelength band, and the blue wavelength band. The first wavelength band may be different from the second and third wavelength bands.

A nanostructure from the plurality of nanostructures may have a one-dimensional or two-dimensional arrangement.

When the nanostructure has the two-dimensional arrangement, the nanostructure may have a square shape, a cylindrical shape, a cylindroid shape, a rectangular shape, a triangular pyramid shape, or a conical shape.

When the nanostructure has the one-dimensional arrangement, the nanostructure may have a bar shape, and wherein the bar shape has a cross-section of a polygonal shape, a circular shape, or an oval shape, wherein the polygonal shape is a triangular shape, a quadrilateral shape, a pentagonal shape, or the like.

The meta-filter may further include a surrounding structure that surrounds the nanostructure. The surrounding structure may have a lower refractive index than the nanostructure.

The nanostructure may include one of single crystal silicon, polycrystalline silicon, amorphous silicon, silicon nitride ($Si_3N_4$), gallium phosphide (GaP), gallium arsenide (GaAs), titanium dioxide ($TiO_2$), aluminum antimony (AlSb), aluminum arsenide (AlAs), aluminum gallium arsenide (AlGaAs), aluminum gallium indium phosphide (AlGaInP), boron phosphide (BP), and zinc-germanium diphosphide ($ZnGeP_2$).

The surrounding structure may include any one of a polymer and an oxide.

The meta-filter may include a surrounding structure that surrounds the nanostructure and has a higher refractive index than the nanostructure.

The nanostructure may include any one of a polymer and an oxide, and the surrounding may include one of single crystal silicon, polycrystalline silicon, amorphous silicon, $Si_3N_4$, GaP, $TiO_2$, AlSb, AlAs, AlGaAs, AlGaInP, BP, and $ZnGeP_2$.

The meta-filter may include a nanostructure arrangement having at least one of a width, an interval, and a symmetrical axis direction varying in a horizontal direction.

According to an aspect of an exemplary embodiment, a stack-type image sensor may include: a first photodiode configured to absorb first light of a first wavelength band; a second photodiode disposed on the first photodiode and configured to absorb second light of a second wavelength band; and a meta-filter including a plurality of nanostructures that satisfy a subwavelength condition, the meta-filter being configured to reflect light of a previously determined wavelength band, and to transmit light of wavelength bands other than the previously determined wavelength band. The meta-filter may further include a first meta-filter disposed between the first photodiode and the second photodiode, the first meta-filter being configured to reflect the second light of the second wavelength band to the second photodiode and to transmit the first light of the first wavelength band.

The meta-filter may further include a second meta-filter disposed in a lower portion of the first photodiode, the second meta-filter being configured to reflect the first light of the first wavelength band to the first photodiode.

The image sensor may further include a third photodiode disposed on the second photodiode and configured to absorb third light of a third wavelength band. The meta-filter may further include a third meta-filter disposed between the second photodiode and the third photodiode and configured to reflect the third light of the third wavelength band to the third photodiode and to transmit the second light of the second wavelength band.

BRIEF DESCRIPTION OF THE DRAWINGS

The above and/or other aspects will become apparent and more readily appreciated from the following description of the embodiments, taken in conjunction with the accompanying drawings in which.

DETAILED DESCRIPTION

Figure 1:
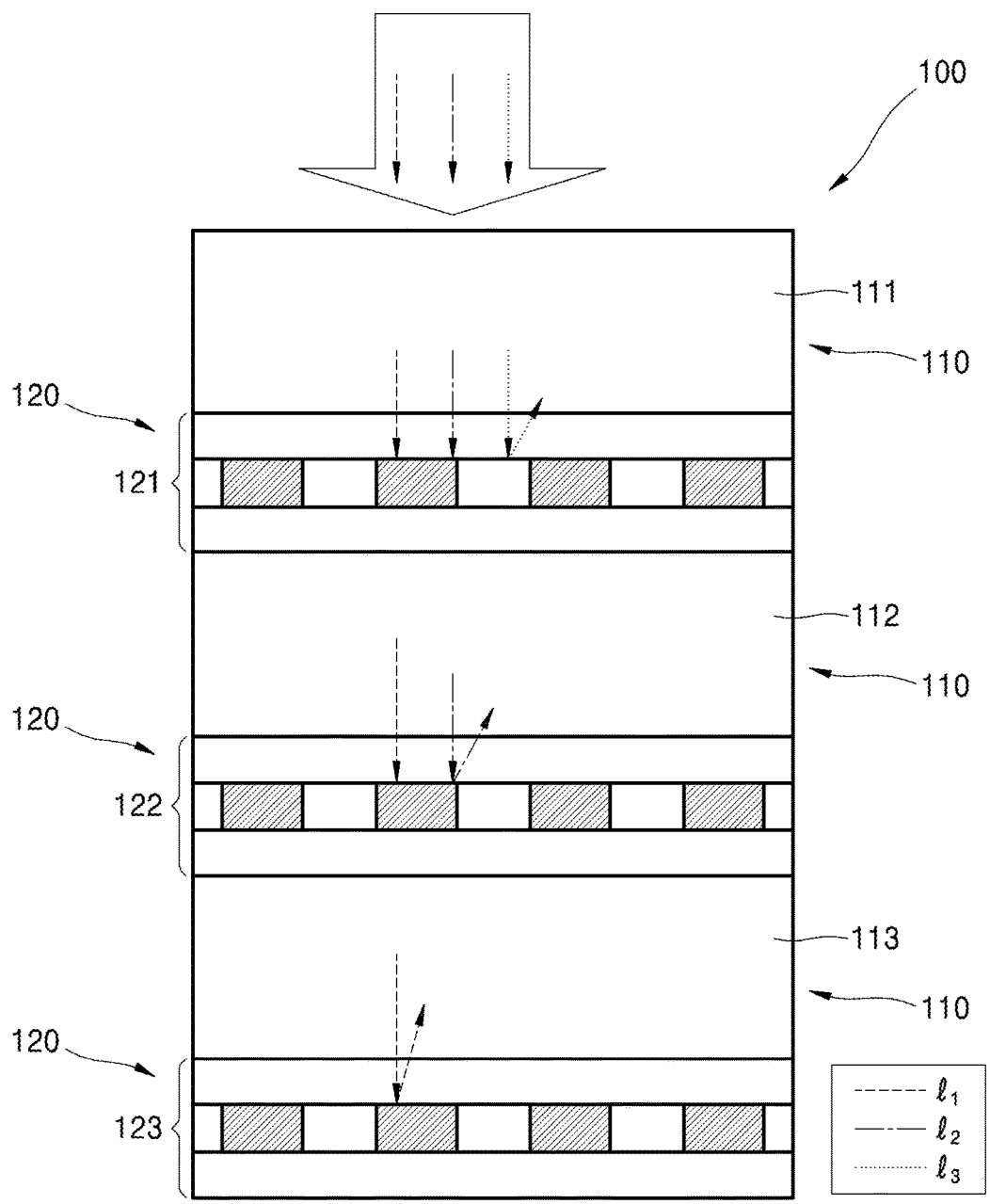
FIG. 1 is a schematic cross-sectional view of a stack-type image sensor according to an exemplary embodiment.

Reference will now be made in detail to various exemplary embodiments, which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects. Expressions such as "at least one of," when preceding a list of elements, modify the entire list of elements and do not modify the individual elements of the list. The word "exemplary" is used herein to mean "serving as an example or illustration." Any aspect or design described herein as "exemplary" is not necessarily to be construed as preferred or advantageous over other aspects or designs.

Like reference numerals refer to like elements throughout. In the drawings, the sizes of constituent elements may be exaggerated for clarity. It will be understood that, although the terms first, second, etc. may be used herein to describe various elements, these elements should not be limited by these terms. These terms are only used to distinguish one element from another.

As used herein, unless the context clearly indicates otherwise, when a unit is referred to as "comprising" another element, it may not exclude other elements but may further include other elements.

Figure 2:
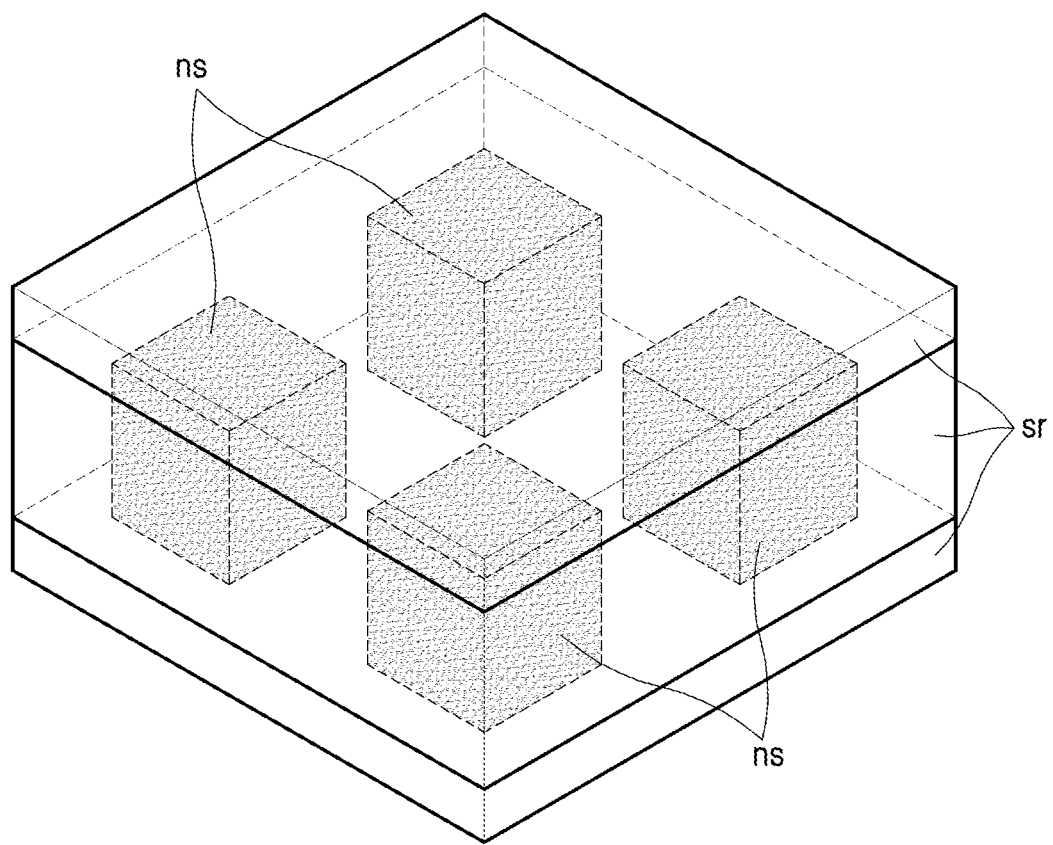
FIG. 2 is a schematic perspective view of a meta-filter according to an exemplary embodiment.
Figure 3A:
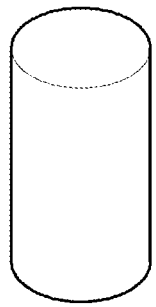
FIGS. 3A-3D illustrate nanostructures according to various exemplary embodiments.
Figure 3B:
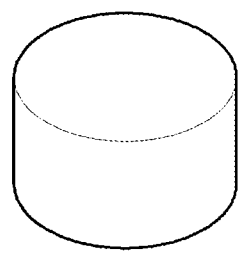
Figure 3C:
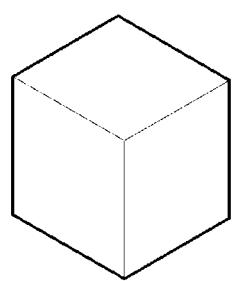
Figure 3D:
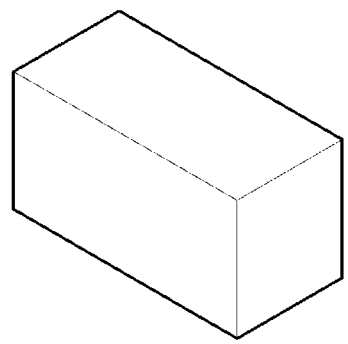

FIG. 1 is a schematic cross-sectional view of a stack-type image sensor 100 according to an exemplary embodiment. FIG. 2 is a schematic perspective view of a meta-filter 120 according to an exemplary embodiment. FIGS. 3A-3D illustrate nanostructures according to various exemplary embodiments.

Referring to FIG. 1, the image sensor 100 may include a photodiode 110 and the meta-filter 120.

The photodiode 110 may include a first photodiode 113, a second photodiode 112 provided on the first photodiode 113, and a third photodiode 111 provided on the second photodiode 112. A first meta-filter 123 may be provided in a lower portion of the first photodiode 113. A second meta-filter 122 may be provided between the first photodiode 113 and the second photodiode 112. A third meta-filter 123 may be provided between the second photodiode 112 and the third photodiode 111.

The photodiode 110 may generate an electrical signal having a magnitude proportional to intensity of an incident light thereon. The first photodiode 113 may absorb a first light $l_1$ of a first wavelength to generate an electrical signal. The second photodiode 112 may absorb a second light $l_2$ of a second wavelength to generate an electrical signal. The third photodiode 111 may absorb a third light $l_3$ of a third wavelength to generate an electrical signal. For example, the photodiode 110 may be an organic photodiode or a quantum dot photodiode that absorbs only light of a specific wavelength. For example, the photodiode 110 may be a silicon photodiode that absorbs light of all wavelengths without any wavelength selectivity.

A thickness of an organic photodiode of a conventional stack-type image sensor may be greater than or equal to 100 nm.

As the thickness of the organic photodiode increases, light absorption efficiency may increase. However, as the thickness of the organic photodiode increases, an electrical problem may occur in that it becomes increasingly difficult to transfer charges to the outside.

However, the stack-type image sensor 100 may include the meta-filter 120, and thus a thickness of an organic photodiode may be less than or equal to 100 nm. When the thickness of the organic photodiode of the stack-type image sensor 100 is 100 nm, light absorption efficiency may be enhanced by 50% compared to the conventional stack-type image sensor of a similar thickness. Light absorption efficiency of the organic photodiode with thickness ranging from about 50 nm to about 70 nm may be comparable to the light absorption efficiency of the conventional organic photodiode with thickness of 100 nm. Detailed simulation results will be described with reference to FIGS. 9 through 11 below.

Thus, the stack-type image sensor 100 may include the meta-filter 120, and thus when the thickness of the organic photodiode is 100 nm, light absorption efficiency may be enhanced compared to the conventional art, and when the thickness of the organic photodiode ranges from about 50 nm to about 70 nm, light absorption efficiency may be maintained and the thickness may be reduced.

In the stack-type image sensor 100, light that may arrive at the first photodiode 113 may be the first light $l_1$ that passed through the second meta-filter 122 and the third meta-filter 121. Thus, the first photodiode 113 may be an organic photodiode or a quantum dot photodiode that absorbs only light of a wavelength of the first light $l_1$ as well as a silicon photodiode that absorbs light of all wavelengths without wavelength selectivity.

However, since light that arrives at the second photodiode 112 may be the second light $l_2$ as well as the first light $l_1$, the second photodiode 112 may have to absorb the light $l_2$ and may not have to absorb the first light $l_1$. Thus, the second photodiode 112 may have to be an organic photodiode or a quantum dot photodiode having selectivity with respect to the second light $l_2$ and may not use the silicon photodiode.

Likewise, the third photodiode 111 may have to be an organic photodiode or a quantum dot photodiode having selectivity with respect to the third light $l_3$ and may not use the silicon photodiode.

The meta-filter 120 may be configured to transmit light of a specific wavelength and reflect light of other wavelengths. The meta-filter 120 may include the first meta-filter 123 that reflects the first light h, the second meta-filter 122 that reflects the second light $l_2$ and transmits light of other wavelengths, and the third meta-filter 121 that reflects the third light $l_3$ and transmits light of other wavelengths. For example, the first meta-filter 123 may reflect red light, and the first photodiode 113 may absorb the red light. For example, the second meta-filter 122 may reflect green light, and the second photodiode 112 may absorb the green light. For example, the third meta-filter 121 may reflect blue light, and the third photodiode 111 may absorb the blue light.

Referring to FIG. 2, the meta-filter 120 may include an arrangement of the nanostructures ns satisfying a subwavelength condition. The meta-filter 120 may employ the nanostructures ns, thereby reducing a thickness as small as possible and reducing processing speed and cost. The nanostructures ns may be covered by a surrounding structure sr.

The nanostructure ns may be a high refractive index material repeatedly arranged at a previously determined period. The nanostructure ns has a hexahedral block shape in FIG. 2 but is not limited thereto and may have various shapes. Referring to FIG. 3, the nanostructure ns may have various shapes such as a cylindroid, of FIG. 3A, a cylinder of FIG. 3B, a regular hexahedral block of FIG. 3C, and a rectangular block of FIG. 3D. Also, although the nanostructures ns are two-dimensionally arranged in rows and columns, the nanostructures ns of each row or each column may be alternately arranged. For example, the nanostructures ns may be arranged as a two-dimensional hexagonal pattern.

The arrangement of the nanostructures ns may satisfy the subwavelength condition. For example, a repeat distance of the nanostructures ns (e.g., a unit interval between successive nanostructures) may be a numerical value less than a center wavelength of a transmittance wavelength band to be transmitted. For example, the repeat distance of the nanostructures ns may be less than ⅔ of the center wavelength. A dimensional element having a longest length among cross sections of the nanostructures ns may be a numerical value less than the center wavelength of the transmittance wavelength band. For example, the dimensional element having the longest length among the cross sections of the nanostructures ns may be less than a half of the center wavelength of the transmittance wavelength band.

The nanostructures ns may include any one of single crystal silicon, polycrystalline silicon, amorphous silicon, silicon nitride ($Si_3N_4$), gallium phosphide (GaP), titanium dioxide ($TiO_2$), aluminum antimony (AlSb), aluminum arsenide (AlAs), aluminum gallium arsenide (AlGaAs), aluminum gallium indium phosphide (AlGaInP), boron phosphide (BP), and zinc-germanium diphosphide ($ZnGeP_2$).

The surrounding structure sr may surround the nanostructures ns. The surrounding structure sr may have a material having a lower refractive index than that of the nanostructures ns. The surrounding structure sr may include a lower layer supporting lower portions of the nanostructures ns, an intermediate layer located at the same level as the nanostructures ns, and an upper layer covering upper portions of the nanostructures ns. The lower layer, the intermediate layer, and the upper layer may include the same material or may include different materials satisfying a lower refractive index than that of the nanostructures ns. The meta-filter 120 in which the nanostructures ns have a higher refractive index than the surrounding structure sr will be referred to as an "embossed structure meta-filter" below.

The surrounding structure sr may include any one of a polymer such as SU8 and PMMA, an oxidizer such as $SiO_2$, etc. The intermediate layer may include air.

Since the first meta-filter 123, the second meta-filter 122, and the third meta-filter 121 have different transmittance bands, at least one of their properties such as a repeat distance of the nanostructure ns included in each meta-filter, a material, a shape, a thickness, etc. may be different for each meta-filter. A transmittance band may be variously determined according to the shape of the nanostructure ns, a difference in a refractive index between the nanostructure ns and the surrounding structure sr, an arrangement, the repeat distance (e.g., regular interval), and the thickness of the nanostructure ns. For example, the material and the shape of the nanostructure ns may be the same with respect to the first meta-filter 123, the second meta-filter 122, and the third meta-filter 121, and the repeat distance or the thickness thereof may be different with respect to the first meta-filter 123, the second meta-filter 122, and the third meta-filter 121, and thus a selection wavelength band may be adjusted.

If each of the photodiodes 112 through 114 may absorb light of each wavelength region and generates charges, a signal wiring layer for reading the charges may be provided. The signal wiring layer may be separately provided in each of the first photodiode 113, the second photodiode 112, and the third photodiode 111. For example, the signal wiring layer may be provided in a lower portion of each of the first photodiode 113, the second photodiode 112, and the third photodiode 111 or on side surfaces of each of thereof. The signal wiring layer may be implemented according to a conventional art, and thus a detailed description thereof is omitted here.

Figure 4:
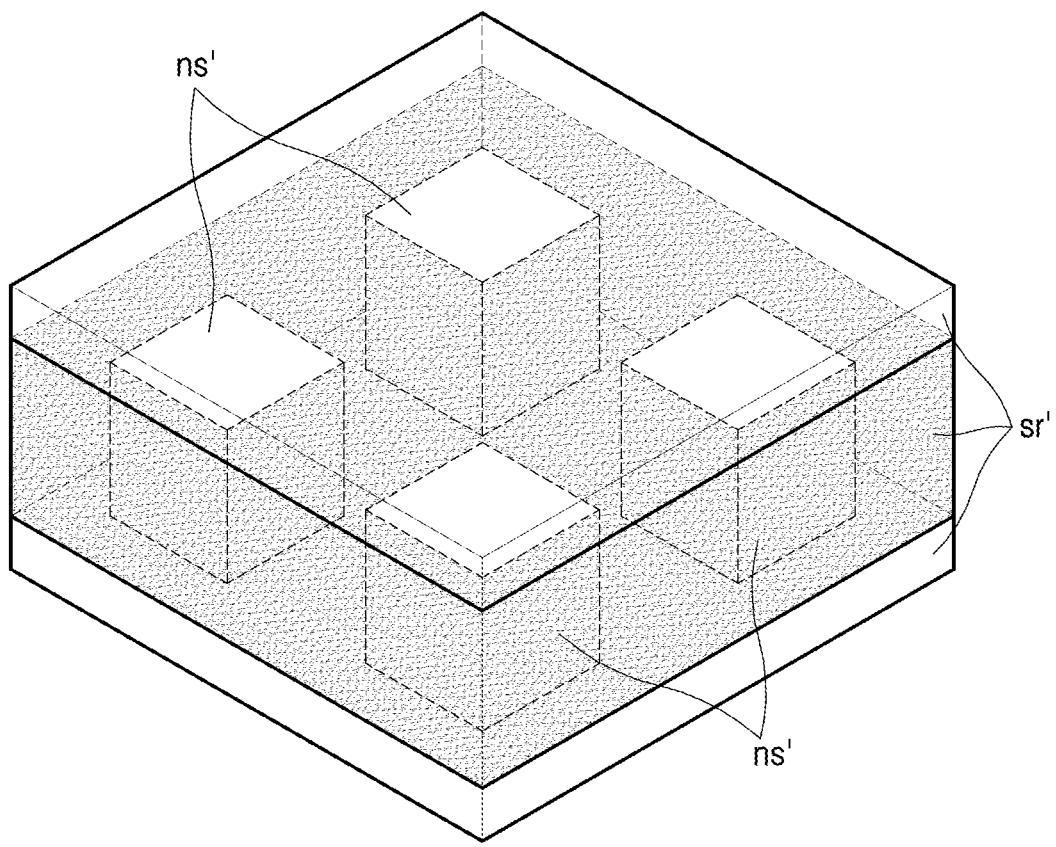
FIG. 4 is a schematic cross-sectional view of a meta-filter according to an exemplary embodiment.

FIG. 4 is a schematic cross-sectional view of a meta-filter according to an exemplary embodiment. Referring to FIG. 4, the meta-filter may be an intaglio structure meta-filter in which an intermediate layer of a surrounding structure sr' includes a high refractive index material, and a nanostructure ns' includes a low refractive index material. Upon comparing the meta-filter of FIG. 4 with the meta-filter of FIG. 2, the nanostructure ns' and the intermediate layer of the surrounding structure sr' have opposite structures in the meta-filter of FIG. 4.

The surrounding structure sr' may include the intermediate layer located at the same level as the nanostructure ns', a lower layer located at a lower portion of the nanostructure ns', and an upper layer covering an upper portion of the nanostructure ns'.

The intermediate layer of the surrounding structure sr' may include any one of single crystal silicon, polycrystalline silicon, amorphous silicon, $Si_3N_4$, GaP, $TiO_2$, AlSb, AlAs, AlGaAs, AlGaInP, BP, and $ZnGeP_2$.

The upper layer and the lower layer may include any one of a polymer such as SU8 and PMMA, an oxidizer such as $SiO_2$, etc.

The nanostructure ns' may include air or may include any one of a polymer such as SU8 and PMMA, an oxidizer such as $SiO_2$, etc.

In the meta-filter according to an aspect of an exemplary embodiment, a wavelength of a transmittance band may also be different according to a shape, a repeat distance, and an arrangement of the nanostructure ns'.

Figure 5:
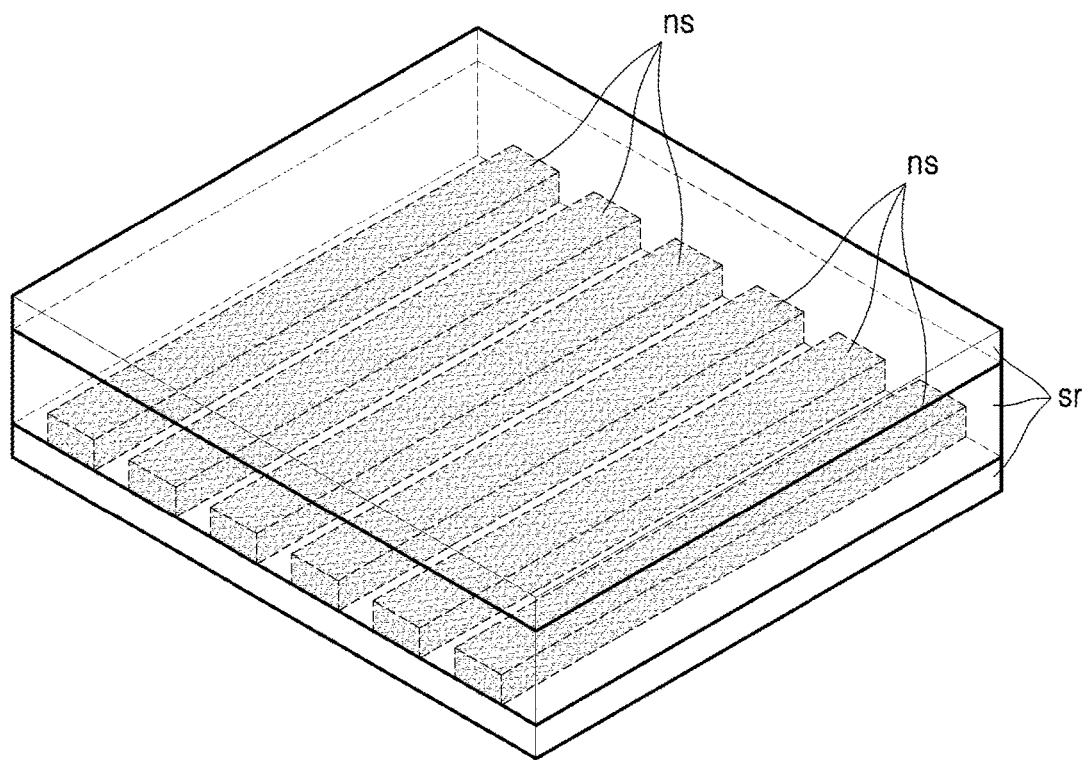
FIG. 5 is a schematic cross-sectional view of a meta-filter according to an exemplary embodiment.

FIG. 5 is a schematic cross-sectional view of a meta-filter according to an exemplary embodiment. Referring to FIG. 5, the meta-filter is different from the meta-filters according to the above-described embodiments in that the nanostructures ns are one-dimensionally arranged repeatedly. The nanostructures ns may protrude in a stripe shape and may be repeatedly arranged in a different direction from the running direction of the stripe. For example, the stripe shape may be repeatedly arranged in a direction perpendicular to the running direction of the stripe but is not limited thereto. A region of the surrounding structure sr between the nanostructures ns may be filled with air or may include any one of a polymer such as SU8 and PMMA, an oxidizer such as $SiO_2$, etc. The surrounding structure sr may include any one of a polymer such as SU8 and PMMA, an oxidizer such as $SiO_2$, etc.

The meta-filter of FIG. 5 is an embossed structure meta-filter but is not limited thereto and may be an intaglio structure meta-filter.

Figure 6:
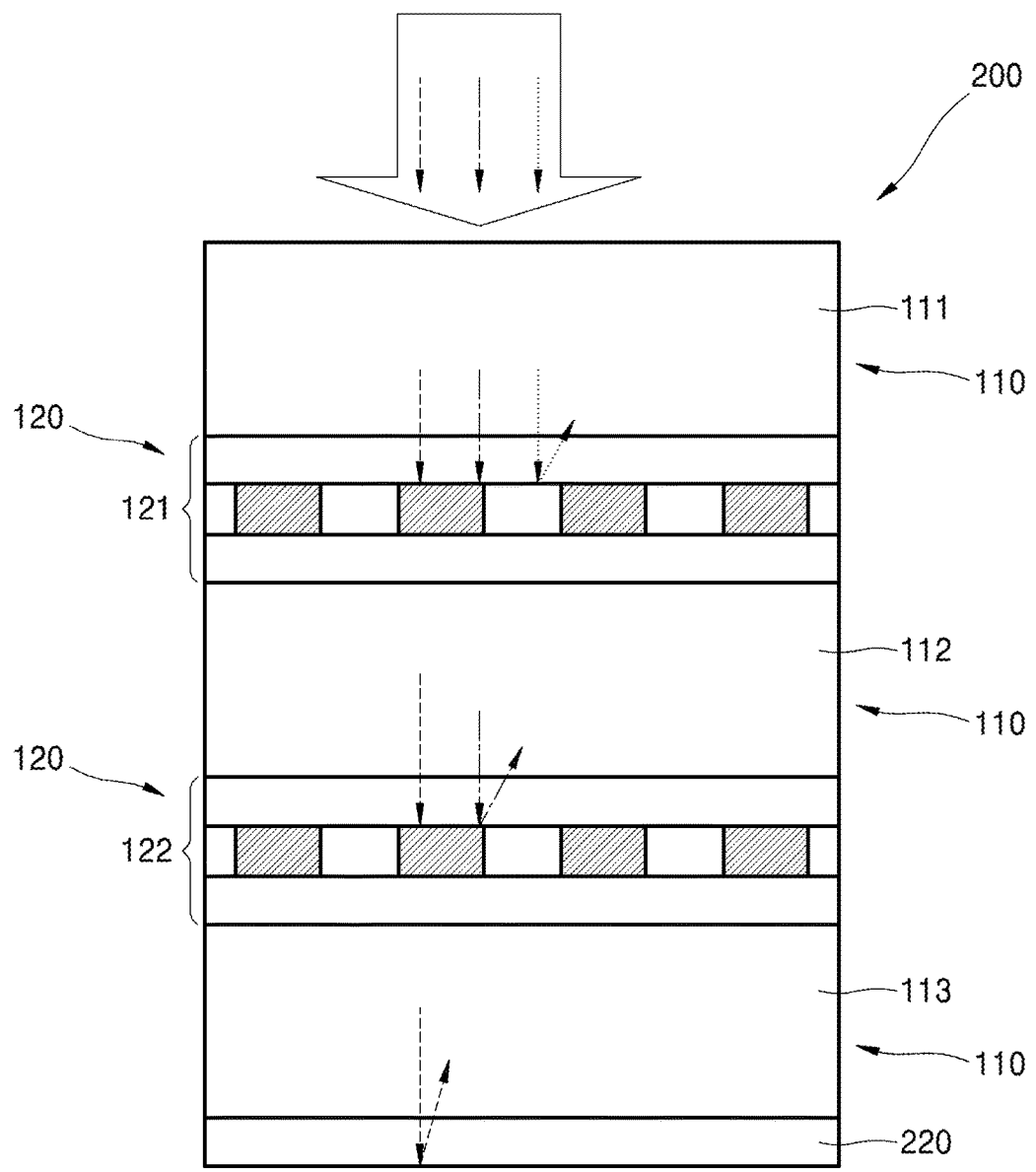
FIG. 6 is a schematic perspective view of a stack-type image sensor according to an exemplary embodiment.

FIG. 6 is a schematic perspective view of a stack-type image sensor 200 according to an exemplary embodiment. Referring to FIG. 6, the stack-type image sensor 200 may include a mirror meta-filter 220 provided in a lower portion of the first photodiode 113. Other components are redundant with respect to the stack-type image sensor 100 of FIG. 1, and thus detailed descriptions thereof will not be repeated here.

The mirror meta-filter 220 may reflect light of a reflection region including the first light $l_1$ absorbed by the first photodiode 113. The mirror meta-filter 220 may reflect light of a wide wavelength band, unlike the meta-filter 120 that transmits light of a certain region and reflects light of a certain region. Thus, the mirror meta-filter 220 may merely use a mirror (including a metal thin film, etc.) or may be implemented as a meta-structure that merely functions as the mirror.

The mirror meta-filter 220 may have an arrangement, a shape, and a repeat distance of a nanostructure that reflects the light of the reflection region as well as the first light $l_1$.

Figure 7:
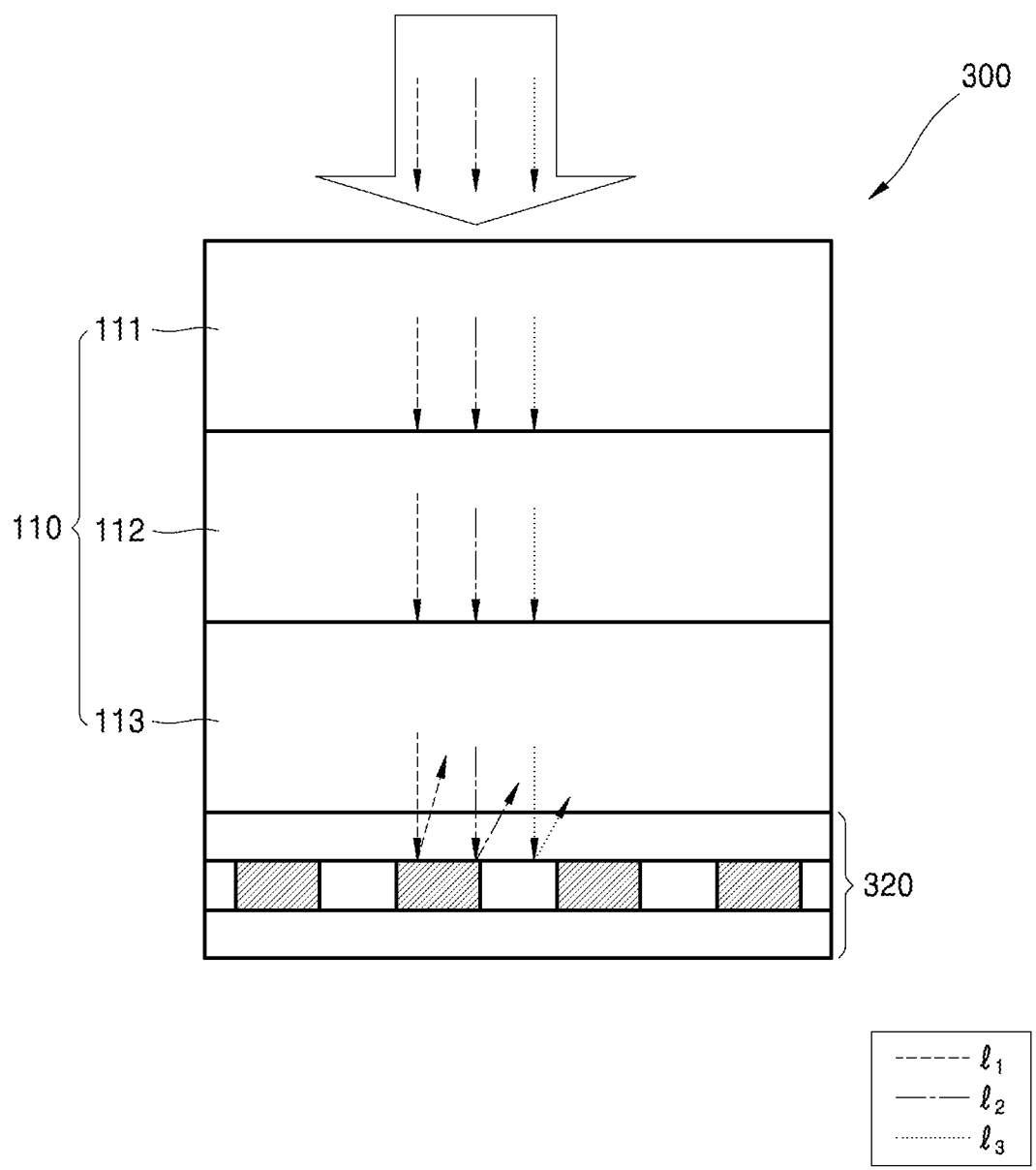
FIG. 7 is a schematic perspective view of a stack-type image sensor according to an exemplary embodiment.

FIG. 7 is a schematic perspective view of a stack-type image sensor 300 according to an exemplary embodiment. Referring to FIG. 7, a meta-filter 320 may be provided only in a lower portion of the first photodiode 113.

The meta-filter 320 may reflect light of a wavelength region including the first light $l_1$, the second light $l_2$, and the third light $l_3$, and may transmit light of other wavelengths. Alternatively, the meta-filter 320 may reflect light of all wavelength regions as well as first light $l_1$, the second light $l_2$, and the third light $l_3$.

The meta-filter 320 may have a single layer structure or a stack structure. For example, the meta-filter 320 may have an arrangement of the single nanostructure ns, thereby reflecting the light of the wavelength region including the first light $l_1$, the second light $l_2$, and the third light $l_3$. For example, the meta-filter 320 may have a structure in which the meta-filter 113 of FIG. 1 that reflects the first light $l_1$, the meta-filter 112 of FIG. 1 that reflects the second light $l_2$, and the meta-filter 111 of FIG. 1 that reflects the third light $l_3$ are stacked.

In the stack-type image sensor 300, all of the first light $l_1$, the second light $l_2$, and the third light $l_3$ may arrive at the first photodiode 113, the second photodiode 112, and the third photodiode 111 without restriction. Thus, instead of a silicon diode having no wavelength selectivity, the stack-type image sensor 300 may use an organic photodiode or a quantum dot photodiode having wavelength selectivity. For example, the first photodiode 113 may absorb only light of a blue wavelength, the second photodiode 112 may absorb only light of a green wavelength, and the third photodiode 111 may absorb only light of a red wavelength.

Figure 8:
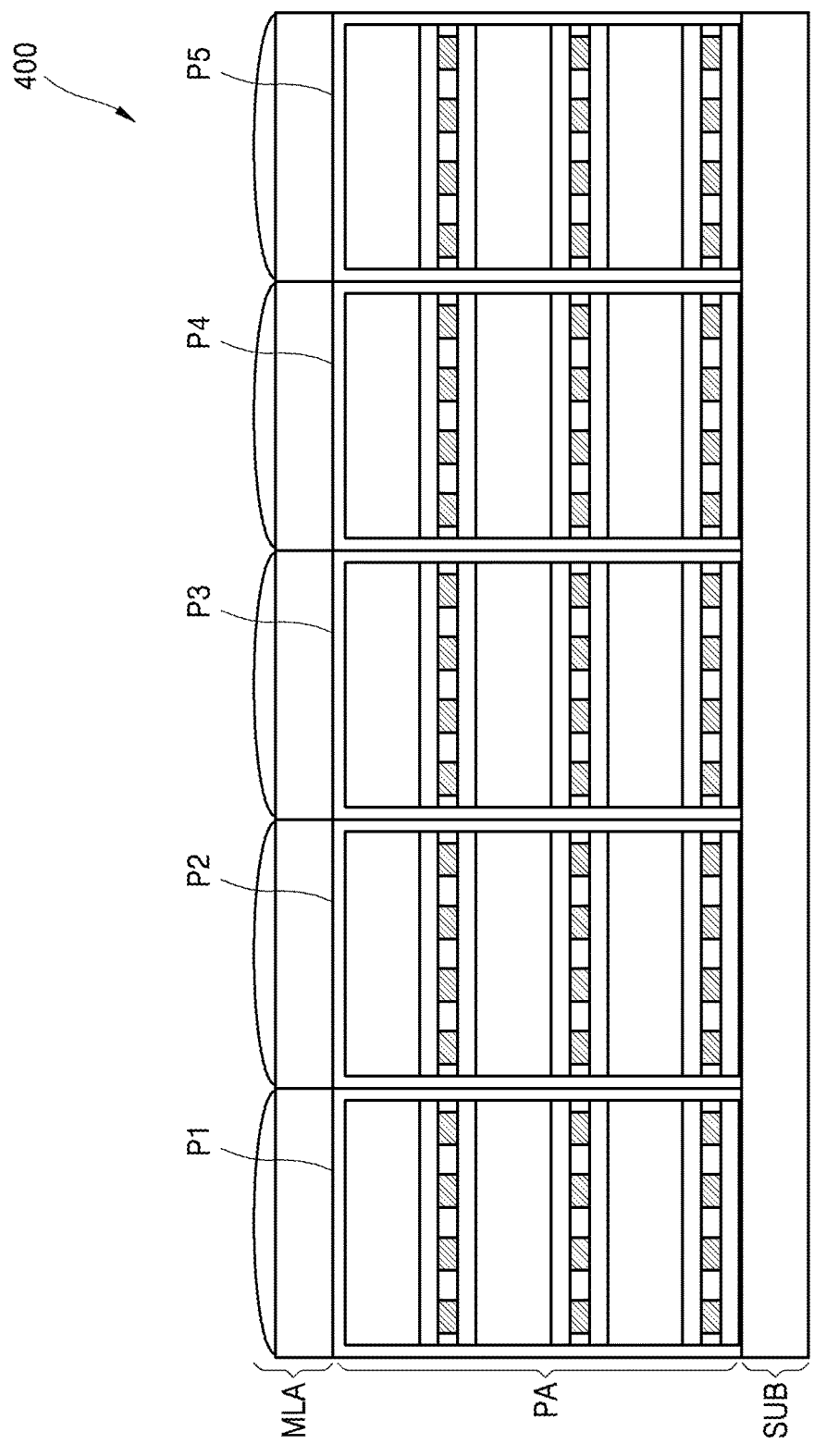
FIG. 8 is a schematic cross-sectional view of an image sensor array including a plurality of stack-type image sensors according to an exemplary embodiment.

FIG. 8 is a schematic cross-sectional view of an image sensor array 400 including a plurality of stack-type image sensors according to the above-described embodiments. Referring to FIG. 8, the image sensor array 400 may include a pixel array PA on a substrate SUB. The pixel array may include image sensors P1, P2, P3, P4, and P5 according to the above-described embodiments. Each of the image sensors P1, P2, P3, P4, and P5 may correspond to pixels. The image sensor 400 may further include a micro lens array MLA corresponding to pixels.

Each of pixels P1, P2, P3, P4, P5 may include one of the stack-type image sensors 100, 200, and 300 of FIGS. 1 through 7. In a conventional image sensor, since one pixel corresponds to only one color, photodiodes corresponding to a plurality of colors needs to be arranged, for example, in a 2×2 grid in order to implement one pixel, and thus, the number of pixels per area is small. However, in the image sensor array 400 according to an aspect of an exemplary embodiment, one pixel may sense all red, green, and blue colors, and thus the image sensor array 400 may have a high resolution (e.g., high density) in a given area. Also, the image sensor array 40 including meta-filters may reduce cost and may be implemented as a high efficiency image sensor having a light absorption rate higher than 50% compared to the conventional image sensor.

Figure 9:
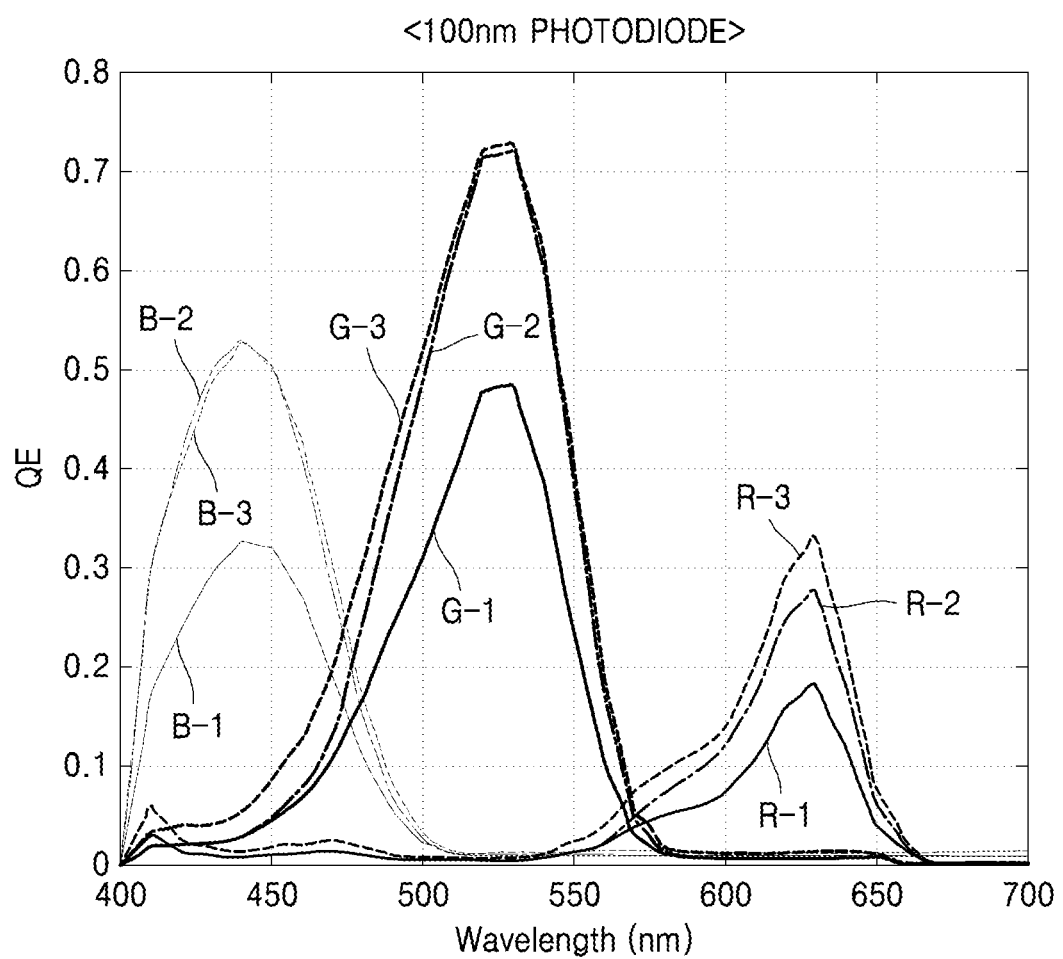
FIG. 9 is a graph of light efficiency of a stack-type image sensor according to an exemplary embodiment.
Figure 10:
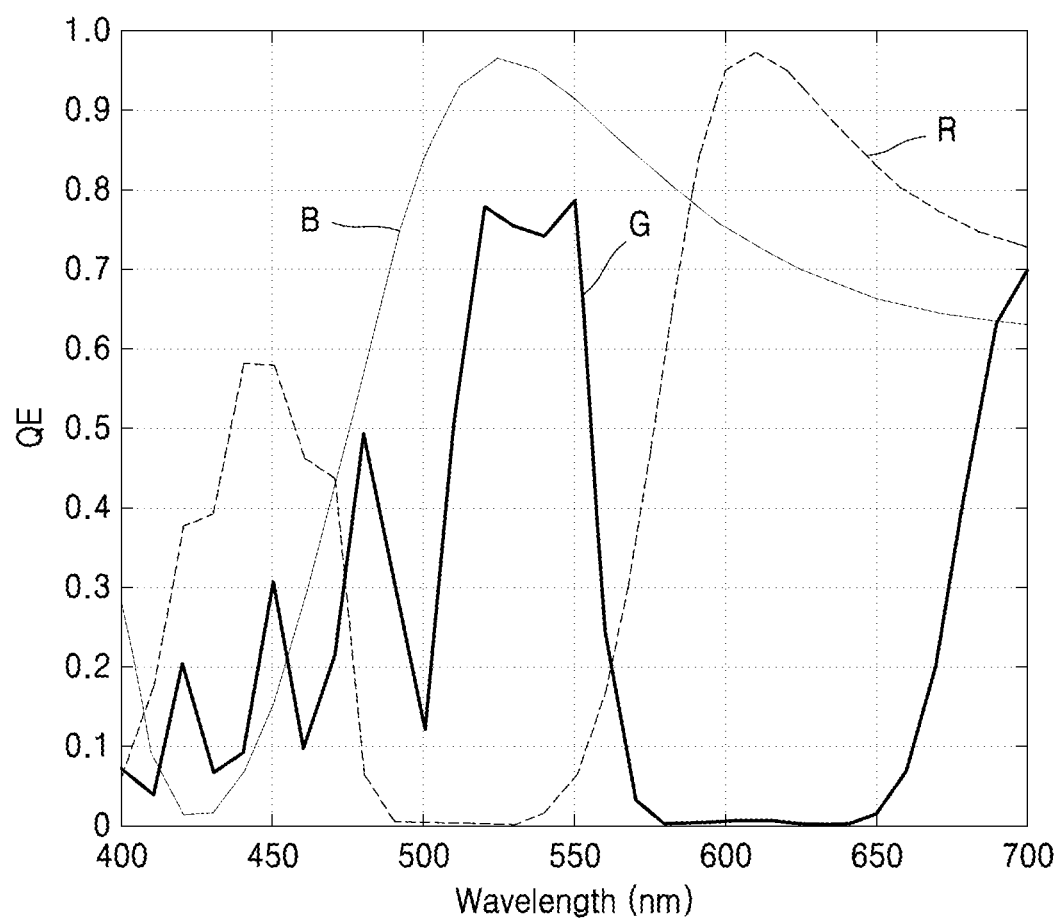
FIG. 10 is a graph of light efficiency of a stack-type image sensor according to an exemplary embodiment.

FIGS. 9 and 10 are graphs of light efficiency of a stack-type image sensor according to an exemplary embodiment. FIGS. 9 and 10 are graphs of simulation results with respect to the stack-type image sensor 100 of FIG. 1.

The stack-type image sensor 100 used in the present simulation employed an organic photodiode having a thickness of 100 nm as the photodiode 110. As a thickness of the organic photodiode increases, light absorption efficiency may increase, whereas an electrical problem may occur in that an increased thickness makes it difficult to transfer charges absorbed by the organic photodiode to the outside. The organic photodiode having the thickness of 100 nm was employed since the organic photodiode resolves the electrical problem and has a high degree of light absorption efficiency.

The first photodiode 113 may absorb blue light. The second photodiode 112 may absorb green light. The third photodiode 111 may absorb red light. The first meta-filter 121 may reflect the blue light. The second meta-filter 122 may reflect the green light. The third meta-filter 123 may reflect the red light.

Referring to FIG. 9, solid lines B-1, G-1, and R-1 may indicate light absorption rates of a stack-type image sensor employing a conventional color filter with respect to wavelengths. Dash-dotted lines B-2, G-2, and R-2 may indicate light absorption rates of a stack-type image sensor employing a meta-filter with respect to wavelengths. Dashed lines B-3, G-3, and R-3 may indicate light absorption rates of a stack-type image sensor employing a mirror type meta-filter with respect to wavelengths. Referring to FIG. 9, the stack-type image sensors B-2, G-2, R-2, B-3, G-3, and R-3 employing the meta-filter may exhibit a light absorption rate increase of 57% in the blue light, a light absorption rate increase of 49% in the green light, and a light absorption rate increase of 47% in the red light, compared to the image sensor employing the conventional color filter B-1, G-1, and R-1.

Referring to FIG. 10, the first meta-filter 121 of FIG. 1 that reflects the blue light may reflect light of a region ranging from about 400 nm to about 450 nm and transmit B light of other regions, the second meta-filter 122 of FIG. 1 that reflects the green light may reflect light of a region ranging from about 500 nm to about 550 nm and transmit G light of other regions, and the third meta-filter 123 of FIG. 1 that reflects the red light may reflect light of a region ranging from about 570 nm to about 650 nm and transmit R light of other regions.

Figure 11:
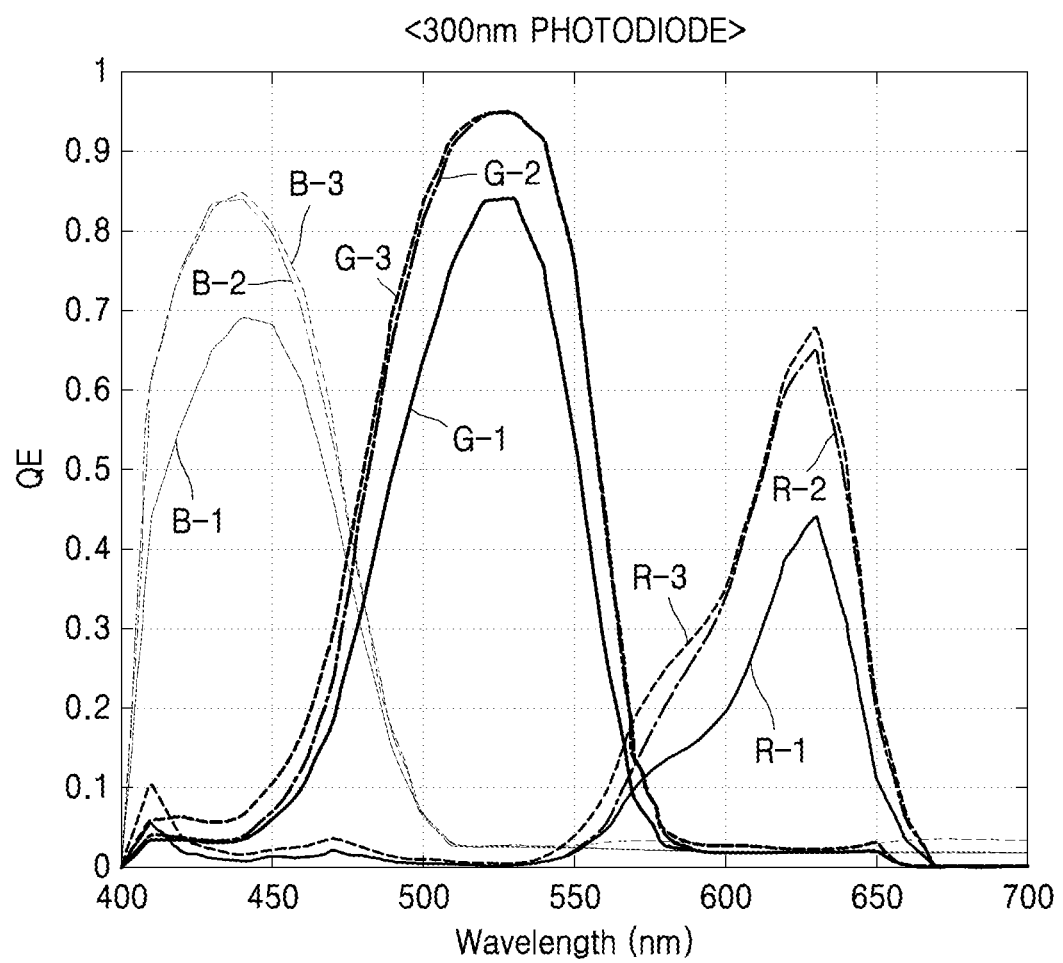
FIG. 11 is a graph of light efficiency of a stack-type image sensor according to an exemplary embodiment.

FIG. 11 is a graph of light efficiency of the stack-type image sensor 100 according to an exemplary embodiment. FIG. 11 is a graph of a simulation result with respect to the stack-type image sensor 100 of FIG. 1.

The stack-type image sensor 100 used in the present simulation employed an organic photodiode having a thickness of 300 nm as the photodiode 110. As a thickness of the organic photodiode increases, light absorption efficiency of a color may increase, whereas an electrical problem may occur in that increased thickness makes it difficult to transfer charges absorbed by the organic photodiode to the outside (e.g., discharge). The organic photodiode having the thickness of 300 nm was employed since the organic photodiode has a high degree of light absorption efficiency.

The first photodiode 113 may absorb blue light. The second photodiode 112 may absorb green light. The third photodiode 111 may absorb red light. The first meta-filter 121 may reflect the blue light. The second meta-filter 122 may reflect the green light. The third meta-filter 123 may reflect the red light.

Referring to FIG. 11, the solid lines B-1, G-1, and R-1 may indicate light absorption rates of a stack-type image sensor employing a conventional color filter with respect to wavelengths. The dash-dotted lines B-2, G-2, and R-2 may indicate light absorption rates of a stack-type image sensor employing a meta-filter with respect to wavelengths. The dashed lines B-3, G-3, and R-3 may indicate light absorption rates of a stack-type image sensor employing the meta-filter with respect to wavelengths. Referring to FIG. 11, the stack-type image sensors B-2, G-2, R-2, B-3, G-3, and R-3 employing the meta-filter may exhibit a light absorption rate increase of 22% in the blue light, a light absorption rate increase of 25% in the green light, and a light absorption rate increase of 52% in the red light, compared to the image sensor employing the conventional color filter B-1, G-1, and R-1.

Upon comparing FIGS. 9 and 11, a light absorption rate increase of FIG. 11 may be relatively less than that of FIG. 9 since, in FIG. 11, the photodiode 110 employed the organic photodiode having the greater thickness of 300 nm, a basic light absorption efficiency is higher, whereas, in FIG. 9, the photodiode 110 employed the organic photodiode having the thickness of 100 nm, the basic light absorption efficiency is lower.

Upon comparing FIGS. 9 and 11, the stack-type image sensor employing the organic photodiode having the thickness of 100 nm may have almost the same light efficiency as the meta-filter and the stack-type image sensor employing the organic photodiode having the greater thickness of 300 nm and the conventional color filter. That is, employing the meta-filter may result in high light efficiency while using an organic photodiode of a relatively small thickness, thereby enabling a thinner and more compact form factor for the stack-type image sensor.

It should be understood that various exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A stack-type image sensor comprising:
   a photodiode comprising:
      a first photodiode configured to absorb first light of a first wavelength band, and
      a second photodiode disposed on the first photodiode and configured to absorb second light of a second wavelength band; and
   a meta-filter comprising a plurality of nanostructures that satisfy a subwavelength condition, the meta-filter being configured to reflect light of a previously determined wavelength band, and to transmit light of wavelength bands other than the previously determined wavelength band,
   wherein the meta-filter further comprises a first meta-filter disposed in a lower portion of the first photodiode, the first meta-filter being configured to reflect the first light of the first wavelength band to the first photodiode.

2. The stack-type image sensor of claim 1, wherein the meta-filter further comprises a second meta-filter disposed between the first photodiode and the second photodiode, the second meta-filter being configured to reflect the second light of the second wavelength band to the second photodiode and to transmit the first light of the first wavelength band.

3. The stack-type image sensor claim 1, wherein the first photodiode is one of (i) a silicon photodiode having no light selectivity and (ii) one of an organic photodiode and a quantum dot photodiode, having light selectivity to sense the first light of the first wavelength band.

4. The stack-type image sensor of claim 3, wherein the photodiode has a thickness ranging from 30 nm to 250 nm.

5. The stack-type image sensor of claim 1, wherein the second photodiode is one of an organic photodiode and a quantum dot photodiode, having light selectivity to sense the second light of the second wavelength band.

6. The stack-type image sensor of claim 1,
wherein the photodiode further comprises a third photodiode disposed on the second photodiode and configured to absorb third light of a third wavelength band, and
wherein the meta-filter further comprises a third meta-filter disposed between the second photodiode and the third photodiode, and configured to reflect the third light of the third wavelength band to the third photodiode and to transmit light of other wavelength bands.

7. The stack-type image sensor of claim 6, wherein the third photodiode is one of an organic photodiode and a quantum dot photodiode, having light selectivity to sense the third light of the third wavelength band.

8. The stack-type image sensor of claim 6, wherein the third wavelength band is one of a red wavelength band, a green wavelength band, and a blue wavelength band,
wherein the second wavelength band is one of the red wavelength band, the green wavelength band, and the blue wavelength band, the second wavelength band being different from the third wavelength band, and
wherein the first wavelength band is one of the red wavelength band, the green wavelength band, and the blue wavelength band, the first wavelength band being different from the second wavelength band and the third wavelength band.

9. The stack-type image sensor of claim 1, wherein a nanostructure from the plurality of nanostructures has one of a one-dimensional arrangement and a two-dimensional arrangement.

10. The stack-type mage sensor of claim 9, wherein when the nanostructure has the two-dimensional arrangement, the nanostructure has one of a square shape, a cylindrical shape, a cylindroid shape, a rectangular shape, a triangular pyramid shape, and a conical shape.

11. The stack-type image sensor of claim 9, wherein when the nanostructure has the one-dimensional arrangement, the nanostructure has a bar shape,
wherein the bar shape has a cross-section of one of a polygonal shape, a circular shape, and an oval shape, and
wherein the polygonal shape is one of a triangular shape, a quadrilateral shape, and a pentagonal shape.

12. The stack-type image sensor of claim 9, wherein the meta-filter further comprises a surrounding structure that surrounds the nanostructure, the surrounding structure having a lower refractive index than the nanostructure.

13. The stack-type image sensor of claim 12, wherein the surrounding structure comprises one of a polymer and an oxide.

14. The stack-type image sensor of claim 9, wherein the meta-filter further comprises a surrounding structure that surrounds the nanostructure, the surrounding structure having a higher refractive index than the nanostructure.

15. The stack-type image sensor of claim 14, wherein the nanostructure comprises one of a polymer and an oxide, and
wherein the surrounding structure comprises one of single crystal silicon, polycrystalline silicon, amorphous silicon, $Si_3N_4$, GaP, $TiO_2$, AlSb, AlAs, AlGaAs, AlGaInP, BP, and $ZnGeP_2$.

16. The stack-type image sensor of claim 9, wherein the meta-filter further comprises a nanostructure arrangement having at least one of a width, an interval, and a symmetrical axis direction varying in a horizontal direction.

17. The stack-type image sensor of claim 1, wherein a nanostructure from the plurality of nanostructures comprises one of single crystal silicon, polycrystalline silicon, amorphous silicon, silicon nitride ($Si_3N_4$), gallium phosphide (GaP), gallium arsenide (GaAs), titanium dioxide ($TiO_2$), aluminum antimony (AlSb), aluminum arsenide (AlAs), aluminum gallium arsenide (AlGaAs), aluminum gallium indium phosphide (AlGaInP), boron phosphide (BP), and zinc-germanium diphosphide ($ZnGeP_2$).

18. A stack-type image sensor comprising:
a first photodiode configured to absorb first light of a first wavelength band;
a second photodiode disposed on the first photodiode and configured to absorb second light of a second wavelength band; and
a meta-filter comprising a plurality of nanostructures that satisfy a subwavelength condition, the meta-filter being configured to reflect light of a previously determined wavelength band, and to transmit light of wavelength bands other than the previously determined wavelength band,
wherein the meta-filter further comprises a first meta-filter disposed between the first photodiode and the second photodiode, the first meta-filter being configured to reflect the second light of the second wavelength band to the second photodiode and to transmit the first light of the first wavelength band.

19. The image sensor of claim 18, wherein the meta-filter further comprises a second meta-filter disposed in a lower portion of the first photodiode, the second meta-filter being configured to reflect the first light of the first wavelength band to the first photodiode.

20. The image sensor of claim 18, further comprising:
a third photodiode disposed on the second photodiode and configured to absorb third light of a third wavelength band,
wherein the meta-filter further comprises a third meta-filter disposed between the second photodiode and the third photodiode, the third meta-filter being configured to reflect the third light of the third wavelength band to the third photodiode and to transmit the second light of the second wavelength band.

* * * * *